(12) United States Patent (10) Patent No.: US 8,917,014 B2
Veerasamy (45) Date of Patent: Dec. 23, 2014

(54) COATED ARTICLES AND/OR DEVICES WITH OPTICAL OUT-COUPLING LAYER STACKS (OCLS), AND/OR METHODS OF MAKING THE SAME

(71) Applicant: Guardian Industries Corp., Auburn Hills, MI (US)

(72) Inventor: Vijayen S. Veerasamy, Ann Arbor, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 0 days.

(21) Appl. No.: 14/084,679

(22) Filed: Nov. 20, 2013

(65) Prior Publication Data

US 2014/0084275 A1 Mar. 27, 2014

Related U.S. Application Data

(62) Division of application No. 13/488,779, filed on Jun. 5, 2012, now Pat. No. 8,608,525.

(51) Int. Cl.
*H01L 51/52* (2006.01)

(52) U.S. Cl.
CPC .................................. *H01L 51/5268* (2013.01)
USPC ........... 313/500; 313/501; 313/502; 313/503; 313/504; 313/505

(58) Field of Classification Search
CPC .................................................... H01L 51/5268
USPC ................................................. 313/500–512
See application file for complete search history.

(56) References Cited

U.S. PATENT DOCUMENTS

| | | | |
|---|---|---|---|
| 4,918,487 | A | 4/1990 | Coulter, Jr. |
| 5,030,594 | A | 7/1991 | Heithoff |
| 5,631,190 | A | 5/1997 | Negley |
| 5,657,607 | A | 8/1997 | Collins et al. |
| 5,664,395 | A | 9/1997 | Collins et al. |
| 5,902,652 | A | 5/1999 | Collins et al. |
| 5,912,477 | A | 6/1999 | Negley |
| 6,299,703 | B1 | 10/2001 | Chen et al. |
| 6,383,571 | B1 | 5/2002 | Mühlfriedel |

(Continued)

FOREIGN PATENT DOCUMENTS

DE 10 2010 023 619 2/2011
WO WO 2006/041559 4/2006

OTHER PUBLICATIONS

U.S. Appl. No. 13/488,779, filed Jun. 5 2012; Veerasamy.
Partial International Search Report mailed Aug. 30, 2013.

(Continued)

*Primary Examiner* — Elmito Breval
(74) *Attorney, Agent, or Firm* — Nixon & Vanderhye P.C.

(57) ABSTRACT

Certain example embodiments relate to organic light emitting diode (OLED) inclusive devices, and/or methods of making the same. A substrate supports a transparent conductive coating (TCC) based layer, and first and second organic layers disposed thereon. A reflective conductive layer is supported by the organic layers. An out-coupling layer stack (OCLS) interposed between the organic layers and a viewer of the device includes a hybrid organic-inorganic polymer matrix having scatterers dispersed throughout in a manner such that each scatterer is located in the far field of its nearest neighbor. The scatterers are dispersed to have a high Zeta potential, and promote Mie-like scattering of light passing through the OCLS. Mie-like scattering caused by the OCLS may help to frustrate the wave-guiding modes in the glass, e.g., by breaking down the in-phase coherence.

5 Claims, 6 Drawing Sheets

(56) References Cited

U.S. PATENT DOCUMENTS

| | | |
|---|---|---|
| 7,557,053 B2 | 7/2009 | Thomsen et al. |
| 7,601,436 B2 | 10/2009 | Djurovich et al. |
| 7,629,741 B2 | 12/2009 | Liao et al. |
| 7,659,661 B2 | 2/2010 | Park |
| 7,662,663 B2 | 2/2010 | Cok et al. |
| 7,663,311 B2 | 2/2010 | Im et al. |
| 7,663,312 B2 | 2/2010 | Anandan |
| 7,700,870 B2 | 4/2010 | Thomsen et al. |
| 7,893,350 B2 | 2/2011 | Thomsen et al. |
| 8,608,525 B1 | 12/2013 | Veerasamy |
| 2003/0203991 A1 | 10/2003 | Schottman et al. |
| 2006/0169316 A1 | 8/2006 | Thomsen et al. |
| 2006/0249199 A1 | 11/2006 | Thomsen et al. |
| 2007/0116896 A1 | 5/2007 | Shylo et al. |
| 2007/0215205 A1 | 9/2007 | Thomsen et al. |
| 2008/0187732 A1 | 8/2008 | Shinohara et al. |
| 2009/0051276 A1 | 2/2009 | Inoue et al. |
| 2009/0151853 A1 | 6/2009 | Cooper |
| 2009/0151854 A1 | 6/2009 | Cooper |
| 2009/0151855 A1 | 6/2009 | Wang et al. |
| 2009/0155499 A1 | 6/2009 | Cooper |
| 2009/0155500 A1 | 6/2009 | Cooper et al. |
| 2009/0223252 A1 | 9/2009 | Fulton et al. |
| 2010/0122728 A1 | 5/2010 | Fulton et al. |
| 2010/0255980 A1 | 10/2010 | Fulton et al. |
| 2010/0275654 A1 | 11/2010 | Wang |
| 2010/0279038 A1 | 11/2010 | Wang |
| 2011/0143045 A1 | 6/2011 | Veerasamy |
| 2011/0157703 A1 | 6/2011 | Broadway et al. |
| 2011/0195239 A1 | 8/2011 | Takane et al. |
| 2011/0214728 A1 | 9/2011 | Veerasamy |
| 2011/0275506 A1 | 11/2011 | Fulton et al. |
| 2011/0290295 A1 | 12/2011 | Veerasamy |
| 2012/0086022 A1 | 4/2012 | Veerasamy et al. |
| 2012/0086023 A1 | 4/2012 | Veerasamy et al. |
| 2012/0087127 A1 | 4/2012 | Veerasamy et al. |
| 2012/0088319 A1 | 4/2012 | Veerasamy et al. |

OTHER PUBLICATIONS

Kristiaan Neyts et al., "Semitransparent Metal or Distributed Bragg Reflector for Wide-Viewing-Angle Organic Light-Emitting-Diode Microcavities," Optical Society of America, vol. 17, No. 1, Jan. 2000, pp. 114-119.

Saso Mladenovski et al., "Integrated Optical Model for Organic Light-Emitting Devices," Journal of Applied Physics 109, 083114, pp. 1-9, 2011.

Milton Abramowitz et al., "Handbook of Mathematical Functions with Formulas, Graphs, and Mathematical Tables," National Bureau of Standards Applied Mathematics Series 55, Chapters 3-6, pp. 9-266, 1972. http://people.math.sfu.ca/~cbm/aands/abramowitz_and_stegun.pdf.

H.C. van de Hulst, "Light Scattering by Small Particles," Copyright Dover 1981.

S. Chandrasekhar, "Radiative Transfer," Copyright Dover 1960.

COATED ARTICLES AND/OR DEVICES WITH OPTICAL OUT-COUPLING LAYER STACKS (OCLS), AND/OR METHODS OF MAKING THE SAME

This application is a division of application Ser. No. 13/488,779, filed Jun. 5, 2012, the entire disclosure of which is hereby incorporated herein by reference in this application.

Certain example embodiments relate to coated articles and/or devices with optical out-coupling layer stacks (OCLS), and/or methods of making the same. More particularly, certain example embodiments relate to out-coupling layer stacks including Mie-like "soft" scatters that help reduce waveguide modes in OLED and/or other device, devices including the same, and/or methods of the above.

BACKGROUND AND SUMMARY OF CERTAIN EXAMPLE EMBODIMENTS

An organic light emitting diode (OLED) is a light-emitting diode (LED) in which the emissive electroluminescent layer is a film of organic compounds which emit light in response to an electric current. This layer of organic semiconductor material is situated between two electrodes in some cases. Generally, for example, at least one of these electrodes is transparent. OLEDs (based on polymers and/or evaporable small molecules) sometimes are used in television screens; computer monitors; small or portable system screens such as those found on mobile phones and PDAs; and/or the like. OLEDs may also sometimes be used in light sources for space illumination and in large-area light-emitting elements. OLED devices are described, for example, U.S. Pat. Nos. 7,663,311; 7,663,312; 7,662,663; 7,659,661; 7,629,741; and 7,601,436, the entire contents of each of which are hereby incorporated herein by reference.

A typical OLED comprises two organic layers—namely, electron and hole transport layers—that are embedded between two electrodes. The top electrode typically is a metallic mirror with high reflectivity. The anode is typically a transparent conductive layer supported by a glass substrate. The top electrode generally is the cathode, and the bottom electrode generally is the anode. Indium tin oxide (ITO) often is used for the anode.

Figure 1:
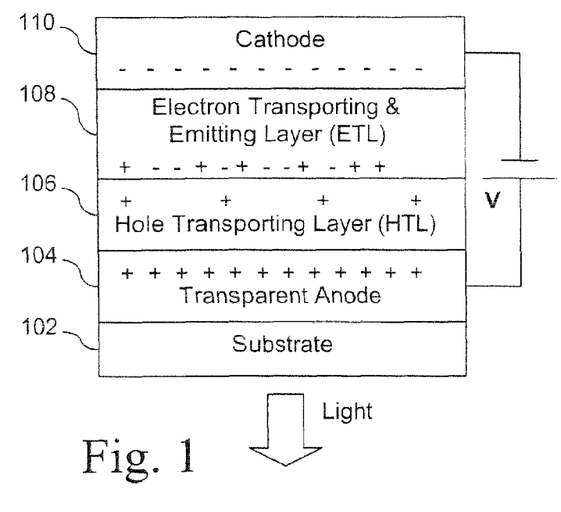
FIG. 1 is an example cross-sectional view of an OLED.

FIG. 1 is an example cross-sectional view of an OLED. The glass substrate 102 supports a transparent anode layer 104. The hole transmitting layer 106 may be a carbon nanotube (CNT) based layer in some cases, provided that it is doped with the proper dopants. Conventional electron transporting and emitting and cathode layers 108 and 110 also may be provided.

When a voltage is applied to the electrodes, the charges start moving in the device under the influence of the electric field. Electrons leave the cathode, and holes move from the anode in opposite direction. The recombination of these charges leads to the creation of photons with frequencies given by the energy gap (E=hv) between the LUMO and HOMO levels of the emitting molecules, meaning that the electrical power applied to the electrodes is transformed into light. Different materials and/or dopants may be used to generate different colors, with the colors being combinable to achieve yet additional colors.

The technology has desirable attributes such as large viewing angle, fast response time, high contrast, and a Lambertian profile.

Although significant progress has been made on the electronic quality of the emissive and charge carrier layers, a significant portion of the light emitted is trapped by both the ITO coating on the glass and the underlying glass substrate, e.g., as wave-guiding modes promoted by interference effects. Because of this inefficiency, some of these devices are driven at higher current densities than what normally would be required. This unfortunately has a negative influence on their lifetimes. Even under these non-nominal driving conditions, the luminous efficiency of OLEDs can be significantly below that of fluorescent lamps.

It would be desirable to improve the light output of an OLED device, e.g., through a light out-coupling strategy. Doing so could improve the lifetime and/or overall luminous efficiency of the device. Several techniques have been proposed to improve the light efficiency, but these methods unfortunately do not meet the practical requirements of manufacturability.

As alluded to above, there have been several attempts to improve techniques for light extraction efficiency. For example, an attempt has been made to increase the extraction from the substrate into the air by way of adding micro-refractive or diffractive structures (e.g., arrays of micro-lenses or pyramids, scattering layers, etc.) to the substrate surface. Depending on the reflectance of the OLED stack, the extraction from the substrate into the air can be increased considerably, typically up to 30%. Unfortunately, however, these structures tend to be quite fragile.

Another attempt relates to monochromatic light emitting devices. In such devices, the angular distribution of the light, emitted into the substrate depends on the layer thicknesses of the OLED stack (e.g., by virtue of the micro-cavity effect). By proper design, the amount of light in the escape cone of the substrate can be increased and external efficiencies of up to 40% can be reached at the design wavelength.

Still another approach involves harnessing the "organic modes" that represent about 50% of the generated photons by the introduction of ordered or random scattering structures into the OLED stack. There is a drawback, however, in terms of a possible negative influence on the electrical performance, inasmuch as the anode would be rough, and localized current hot spots that are detrimental to device performance can develop.

A persistent challenge involves attempts at matching the refractive index of the glass substrate and the organic layers so that the organic modes are turned into substrate modes. The amount of light extracted into the substrate can indeed be increased by a factor 2-3, at least theoretically.

Provided that the OLED has a highly reflective cathode and is thick enough, 80% of the photons generated inside the OLED can be extracted into a high index substrate. However, the remaining issue is still then to out-couple this light into air without reverting back to one of the above-described strategies.

Figure 2:
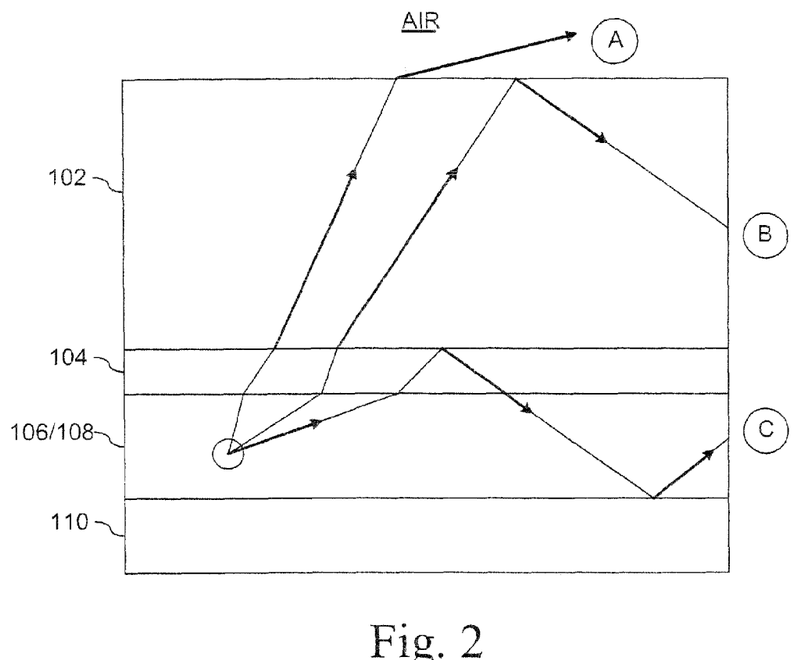
FIG. 2 shows different major light modes in connection with a schematic view of an OLED device.

FIG. 2 shows different major light modes in connection with a schematic view of an OLED device. As can be seen, the major modes include a light in air mode (A), a light in glass mode (B), and a light trapped in the organic layers and/or the ITO. It will be appreciated that there may be more "B-modes" where the glass is thicker and/or more absorptive. It is noted that there also is another component related to Plasmon losses in the cathode, although this is not depicted in the FIG. 2 schematic view.

In view of the foregoing, it will be appreciated that there is a need in the art for techniques for improving the light emitting efficiencies of OLED devices.

One aspect of certain example embodiments relates to a light out-coupling layer stack (OCLS) on a substrate (e.g., on a glass substrate), with a view towards reducing wave-guiding modes.

Another aspect of certain example embodiments relates to scalable techniques for achieving higher luminous efficiency in OLEDs.

Certain example embodiments relate to a method of making an electronic device is provided. An optical out-coupling layer stack (OCLS) is disposed, directly or indirectly, on a substrate. A layer comprising a transparent conductive coating (TCC) (e.g., a transparent conductive oxide or TCO) is disposed, directly or indirectly, on the OCLS. One or more light emitting layers is/are disposed, directly or indirectly, on the layer comprising the TCC. A layer comprising conductive material is disposed, directly or indirectly, on the one or more light emitting layers. The OCLS comprises an isotropic layer matrix including an organo-metallic chelate hybrid material and a matrix core including dispersed scatterers. The OCLS has an index of refraction of at least about 1.8. The dispersed scatterers have a Mie-like scattering efficiency of greater than 1, leading to an index matching out-coupling efficiency for the OCLS of greater than 1.

Certain example embodiments relate to a method of making an organic light emitting diode (OLED) inclusive device is provided. A layer comprising a transparent conductive coating (TCC) is disposed, directly or indirectly, on a glass substrate. First and second organic layers are disposed, directly or indirectly, on the layer comprising the TCC. A layer comprising a conductive material is disposed, directly or indirectly, on the one or more light emitting layers, with the layer comprising conductive material being reflective. An optical out-coupling layer stack (OCLS) is disposed, directly or indirectly, on the substrate, with the OCLS including an isotropic layer matrix including an organo-metallic chelate hybrid matrix with scatterers dispersed therein. A relative refractive index m of the OCLS, a size r of the scatterers, and a concentration of the scatterers ($1/s^3$) are selected so as to increase the total integrated light out-coupled from the device to a level where total out-coupling efficiency for the device is greater than it would, if no OCLS were provided.

Certain example embodiments relate to an organic light emitting diode (OLED) inclusive device is provided. A glass substrate is provided. A layer comprising a transparent conductive coating (TCC) is supported by the substrate. First and second organic layers are supported by the layer comprising the TCC. A reflective conductive layer is supported by the first and second organic layers. An out-coupling layer stack (OCLS) is interposed between the organic layers and a viewer of the device. The OCLS includes a hybrid organic-inorganic polymer matrix having scatterers dispersed throughout in a manner such that each scatterer is located in the far field of its nearest neighbor. The scatterers are sized, shaped, and positioned relative to one another so as to (a) have a high Zeta potential, and (b) promote Mie-like scattering of light passing through the OCLS.

These and other embodiments, features, aspect, and advantages may be combined in any suitable combination or subcombination to produce yet further embodiments.

BRIEF DESCRIPTION OF THE DRAWINGS

These and other features and advantages may be better and more completely understood by reference to the following detailed description of exemplary illustrative embodiments in conjunction with the drawings, of which.

DETAILED DESCRIPTION OF CERTAIN EXAMPLE EMBODIMENTS

A significant amount of emitted light from an organic light emitting diode (OLED) may be trapped as a result of total internal reflection (TIR) within several layers and interfaces (e.g., the light emitting-anode, anode-glass, and glass-air interfaces). It has been observed that only about 50% of the light emitted makes it into the glass substrate, with the trapped being absorbed within the anode/organic layers/cathode layer stack. Certain example embodiments increase the light extraction efficiency by combining both an index matching layer, as well as a total internal reflection (TIR) frustrating medium on one or both sides of the glass in a manner that helps improve forward scattering of light. For example, a model of the current OLED structure is developed based on the Mie-Lorenz theory and, based on this mode, it is possible to simulate and optimize forward Mie scattering by solving for the S matrix. Provided the cathode is perfect reflector, almost 100% of light trapped by the TIR can be extracted if the radius of the scatters, scatterer index profile, refractive index ratio between the matrix and the scatterer, and concentration of the scatterers are carefully selected. The light extraction is defined by the equation, $\Gamma o/\Gamma_i = \eta_{imL} \times \eta_s$. Certain example embodiments make use of this approach and involve an OCLS layer stack system. Data is provided to support the beneficial effect in the case of spherical scatterers in a high index matrix. While certain example embodiments may be used in connection with solid state light sources, the example approaches described herein may additionally or alternatively be used in other applications where light extraction for a distributed light source over a certain solid angle is necessary or desirable.

As indicated above, certain example embodiments help improve the light emitting efficiencies of OLED devices, e.g., through an optical out-coupling layer stack (OCLS) system. An OCLS may help to provide an index matching layer between the glass and ITO/organic stack (and/or polymer LED stack), e.g., to help increase the light otherwise coupled into the glass. Mie-like scattering caused by the OCLS may help to frustrate the wave-guiding modes in the glass, e.g., by breaking down the in-phase coherence. In a related manner, Mie-like forward scattering may be increased, even with reduced spectral dispersion.

For example, $\Gamma_i(\Omega, k)$ can be defined as the photon flux incident to the glass surface, and $\Gamma_o(\Omega,k)$ can be defined as the output flux in air, where the symbols $\Omega$ and k are solid angle and wave vector, respectively. The ratio is now boosted by a factor $\eta_{imL} \times \eta_s (\Omega, k)$, where $\eta$ is the index matching efficiency of the OCLS matrix/adjacent planarizer and where $\eta_s$ is the scattering efficiency. The total flux output can the be calculated by computing the double integral $\iint \Gamma_i (\Omega, k) \eta_{iml} \times \eta_s (\Omega, k) d\Omega dk$ over the entire phase space. However, based on this model, one can see that the necessary condition is that the product $\eta_{iml} \times \eta_s > 1$. Certain example embodiments described below demonstrate how this regime can be implemented.

The OCLS may be a multilayer system in certain example embodiments, with its functionality being based at least in part on how its various components are optimized so as to achieve the desired performance. In certain example embodiments, the OCLS may include a thick isotropic layer matrix, with a matrix layer core that includes dispersed spherical scatterers, and an optional planarization layer. Each of these components is discussed in greater detail, below.

As indicated above, the OCLS may include a thick isotropic layer matrix, e.g., located between the glass and anode. This layer may include an organo-metallic chelate hybrid with a high refractive index, preferably greater than 1.7, more preferably of 1.8-1.9, and potentially even higher in some cases. The absorption coefficient may be near zero in some cases. The chemistry of the matrix layer is described in, for example, U.S. Publication No. 2012/0088319, the entire contents of which are hereby incorporated herein by reference.

As the '319 publication describes, certain example embodiments may involve hybrid coating systems based on polymeric titanium dioxide and/or polymeric zirconia based systems. The organic-inorganic hybrid polymer solution is prepared by first reacting the titanium alkoxide with a chelating agent to convert the highly reactive tetra-coordinate titanium species to a less reactive hexa-coordinate species. Other desired polymer components may then be added to the stabilized titanium containing solution and thoroughly mixed. As a result of the stabilization, the hybrid polymer solution may be stable at room temperature up to 6 months with negligible change in color and viscosity. The hybrid polymer solution may be spin-coated or vertical slot coated onto substrates to a desired thickness.

A titanium dioxide rich film was generated by thermally decomposing the hybrid coatings at an elevated temperature of less than about 250 degrees C. The resulting dried films may be made as thin as 0.2 um and up to about 4 um or more. Such films may have good transparency and have refractive indices as high or higher than about 1.90 in the entire visible region when the cure temperature was 300 degrees C. or higher. A crack-free film over 300 nm in thickness was obtained with a single coating application. Multiple-coating is applicable to obtain a thicker film, and no apparent interface was seen from SEM cross-section images between two consecutive coatings. The hybrid high refractive index films are mechanically robust, stable upon exposure to both heat and UV radiation, and may be applicable for a wide variety of optical applications. The material is compatible with semiconducting material.

In certain example embodiments, the organic-inorganic hybrid polymer may be introduced into a laminable medium such as ethylene-vinyl acetate (EVA), silicones, aramids, etc. This would then allow the use of vacuum bonding or de-airing, sometimes without the use of autoclave.

The organic polymers chosen contained multiple hydroxy functionalities. They were so chosen to allow primary or secondary chemical bonding between the polymer and the titanium dioxide phase to promote phase compatibility and a high degree of dispersion. The chelated poly(dibutyl titanate) polymer and the organic polymer are compatible in all or substantially all proportions, both in solution and in the cured film, as evidenced by their high transparency and the refractive index dispersion curves. Typically, an index as high as or higher than 1.9 is obtained at 550 nm for a thickness of 0.4 um. When deposited on any inorganic light emitting diode, even a film as thin as 0.4 microns dramatically improves the light out-coupling from the high refractive index material significantly typically in the incremental range of 70%.

An inorganic-based precursor is provided. In certain example embodiments, the inorganic-based precursor may be a titanium-based precursor such as, for example, titanium alkoxide, a titanium-based phosphate complex, etc. The inorganic-based precursor may be deposited directly or indirectly on the device and/or substrate to be coated. For instance, in certain example embodiments, a titanium alkoxide based precursor may be deposited via atomic layer deposition (ALD), a titanium-based phosphate layer may be printed, etc. Of course, it will be appreciated that other high-index inorganic materials may be used in place of or in addition to the titanium in certain example embodiments.

A chelate may be formed, and an organic component may be added, together with optional additives. The chelate in certain example instances may be salicylic acid. The organic component in certain example embodiments may be a resin, silicone, polyimide, polyamide, and/or the like. Optional additives also may be introduced. For instance, other inorganic materials (e.g., in place of or in addition to the titanium-based precursor) may be introduced to tune the index of refraction. Indeed, the index of refraction may be adjusted upwardly or downwardly by selective inclusion of zirconia, silica and/or silicates, etc. Light scattering elements and/or heat dissipating elements also may be introduced. One example material that functions both as a lighter scattering agent and a heat dissipater is boron nitride. Plasticizers also may be included in certain example embodiments.

The chelated titanium-based precursor and the organic component(s) may be cross-linked to create an organic-inorganic hybrid solution. In one example, titanium alkoxide may be reacted with a chelating agent to convert the tetra-coordinate Ti species into a less reactive hexa-coordinate species, e.g., to create chelated poly(dibutyl titanate). Of course, other titanates may be created and/or used in different embodiments of this invention. The hybrid polymer may result in certain example instances by mixing together the chelated poly(dibutyl titanate) with a hydroxy inclusive organic resin. In certain example embodiments, the organic and inorganic components may be provided in equal percentages by weight. In certain example embodiments, the organic and inorganic components may be provided in a ratio of 60/40 by weight. Of course, other ratios and/or percentages are possible in different embodiments of this invention.

The hybrid solution may be quite liquidous in certain example embodiments. In such a case, the hybrid solution may be wet applied, vertical slot meniscus coated, or otherwise provided to a desired thickness. Example coating techniques are described in, for example, U.S. Pat. No. 6,383,571, the entire contents of which are hereby incorporated herein by reference. In certain example embodiments, however, it may be desirable to provide a more viscous hybrid laminate (e.g., inorganic and/or other materials included in an organic binder such as EVA, silicones, aramids, etc.) that can be extruded, for example. A more viscous hybrid laminate may be advantageous in terms of a "cleaner" or "less messy" application.

The coated hybrid polymer or laminate is dried and/or cured. The drying and/or curing may help to remove solvents and water, leaving more inorganic material than organic material in certain example embodiments. The drying may take place at a first elevated temperature of less than about 250 degrees C., whereas the curing may take place at a second elevated temperature of greater than or equal to about 300 degrees C. Certain example embodiments may include one or both of drying and curing at these and/or any other suitable temperature.

Thus, in summarizing these example basic formulation, cross-linking, and curing steps, it will be appreciated that a chelated Ti-based precursor is brought into contact with a resin binder; the resin binder and the chelated Ti-based precursor are cross-linked; the solvent is evaporated through a heating process, and the cured film is adhered to a substrate (e.g., a film, hard surface, glass, etc.). In so doing, either (a) the organic-inorganic hybrid solution is wet applied on the substrate over the at least one LED, or (b) the organic-inorganic hybrid solution is introduced into a carrier medium and then the carrier medium is extruded onto the substrate over the at least one LED. The organic-inorganic hybrid solution is cured once disposed on the substrate, e.g., in forming the coating.

The rheological property of the matrix preferably is such that it can be dispensed either by zone casting or a slot meniscus coating over large areas of glass, and rapidly cured, e.g., by heat and/or UV exposure. When cured, it may help to effectively index match to the anode (e.g., ITO inclusive) and light emitting (e.g., organic) layers. In some cases, this portion of the OCLS may be 10-100 um in thickness. The smoothness of this layer preferably is on the order of the smoothness of glass and has an RMS roughness of less than or equal to 1.0 nm and more preferably of less than or equal to about 0.5 nm.

One of the routes for the matrix implementation is the use of glassy polymeric monomer to which titanium, hafnium, and/or zirconium oxo-clusters are added. When polymerization of the monomer is done in the presence of 10-30% by weight of $Zr_4O_2(OMc)_{12}$, for example, a clear and high index film is produced with high flexural strength and extremely good adhesion to the glass substrate. The use of an appropriate surfactant and coupling agent may assist in slot dispensing uniformity. The organic surface of $Ti_{16}O_{16}(OEt)_{32}$ cluster can be selectively modified by alcoholysis. This gives rise to new functional clusters, $Ti_{16}O_{16}(OEt)_{32}$-x(OR)x, where R can be a methacrylate or styrene and x is the number of modified alkoxy ranging anywhere from 4 to 16 depending, for example, on the pH.

The resulting matrix thus combines advantages of polymers (e.g., processability, flexural strength, etc.) and those of inorganic building blocks (such as, for example, high refractive index in the case of the transition alkaloids and chemical inertness, thermal and environmental stability, etc.). The index matching layer (imL) alone has good out-coupling efficiencies for incidence angles near zero and is also angle dependent.

Figure 3:
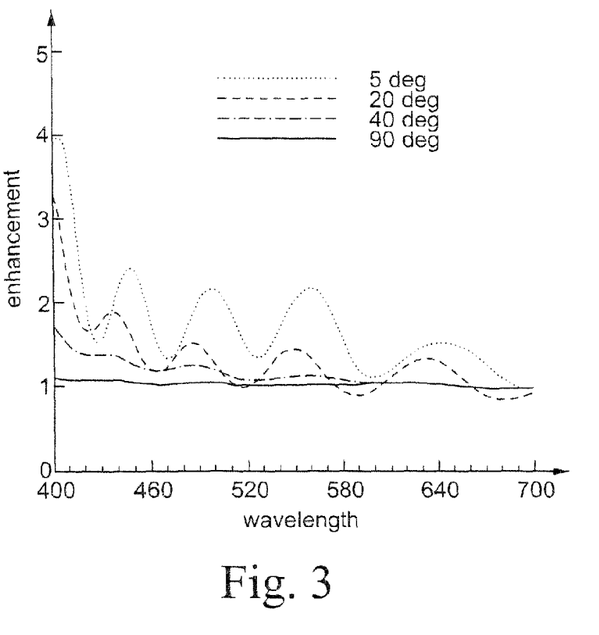
FIG. 3 shows the efficiency of the index matching layer matrix of certain example embodiments as a function of wavelength and angle of incidence.

FIG. 3 shows the efficiency of the imL matrix of certain example embodiments as a function of wavelength and angle of incidence. A refractive index of 1.9 at 500 nm and a dispersion typical of the metallo-organic polymer was used in generating the FIG. 3 data, e.g., in accordance with the '319 publication.

The matrix layer core includes generally spherical scatterers that preferably are dispensed in such a manner that they are not clumped together. The Zeta potential of the scatterer colloid used preferably is high for good stability of the system, and sometimes is even greater than 70 mV. As is known, the Zeta potential refers to electro-kinetic potential in colloidal systems. Zeta potential is the potential difference between the dispersion medium and the stationary layer of fluid attached to the dispersed particle. Those skilled in the art generally consider a value of 25 mV as the value that separates low-charged surfaces from highly-charged surfaces. It is noted that the Zeta potential value sometimes is related to the stability of the colloidal dispersion, e.g., such that high values indicate greater stability, etc. These values also help ensures that the scatterer filling density is in a range of values such that the spheres are mono-dispersed with an inter-particle distance d of about 3 sphere-diameters (or 6r). If this condition is met, then their separation is sufficiently large so that contribution of secondary waves to the field exciting each particle is much smaller that the external field.

The total scattered field therefore can be approximated by the sum of scattered fields generated by an individual independent scatterer. This regime is called a single scattering event. In this regime, each scatterer preferably is located in the far field of its nearest neighbor, and preferably there is no systematic phase relationship. One exception is the case of exact forward scattering, which is generally always coherent. In the other extreme, when the density of particles is large, then each particle scatters light that has already been scattered by other particles. This condition gives rise to diffuse scattering, which can have a large backscatter response. The condition of diffuse scattering can be promoted by setting a threshold limit to scatterer density. The scatterers thus may be produced in a manner so that they have a surface static charge and, when placed in the pre-cured matrix layer, helps keeps the particles apart. The scatterers can be made of an optically soft but low k material (e.g., refractive index less than medium and thus, for example, somewhere between 1.3-1.7, for instance), such that the ratio of ns/nl=m<1. However one can use values such that m≥1 in other example embodiments.

Figure 4A:
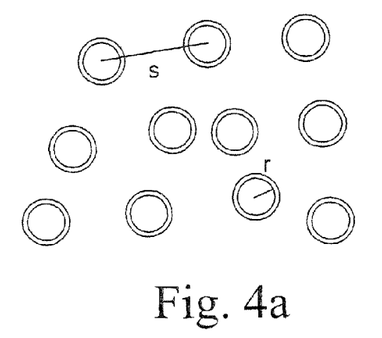
FIGS. 4a and 4b schematically show mono-dispersed scatterers with different inter-distance spacings, and with different Zeta potentials.
Figure 4B:
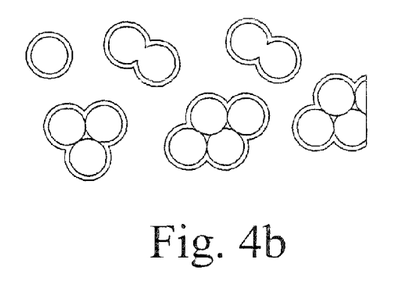

FIGS. 4a and 4b schematically show mono-dispersed scatterers with different inter-distance spacings, and with different Zeta potentials. In FIG. 4a, the inter-distance s is greater than 3d, which helps to ensure a single scatter. The Zeta potential in FIG. 4a is high, e.g., at a value greater than 75 mV. By contrast. FIG. 4b shows agglomerated or clustered scatters in a high-index isotropic matrix. The Zeta potential in FIG. 4b is low, e.g., at about of about 10 mV.

Figure 5A:
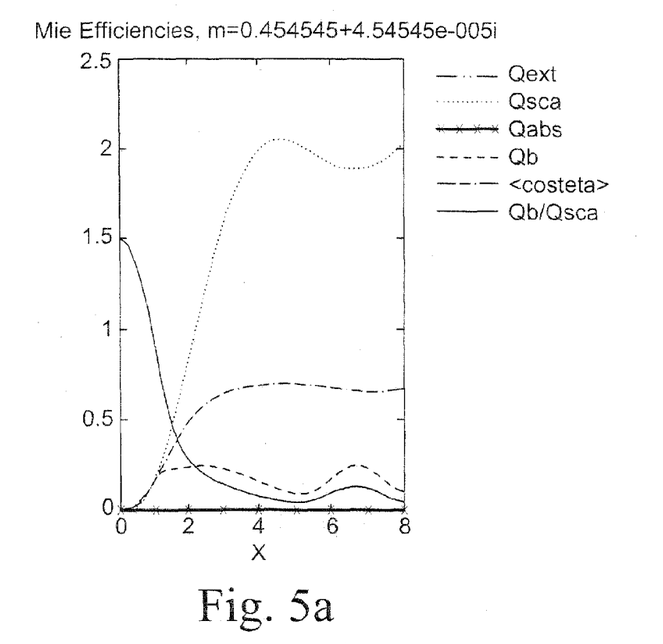
FIG. 5a is a graph plotting the scattering efficiency of one scatterer in connection with certain example embodiments.
Figure 5B:
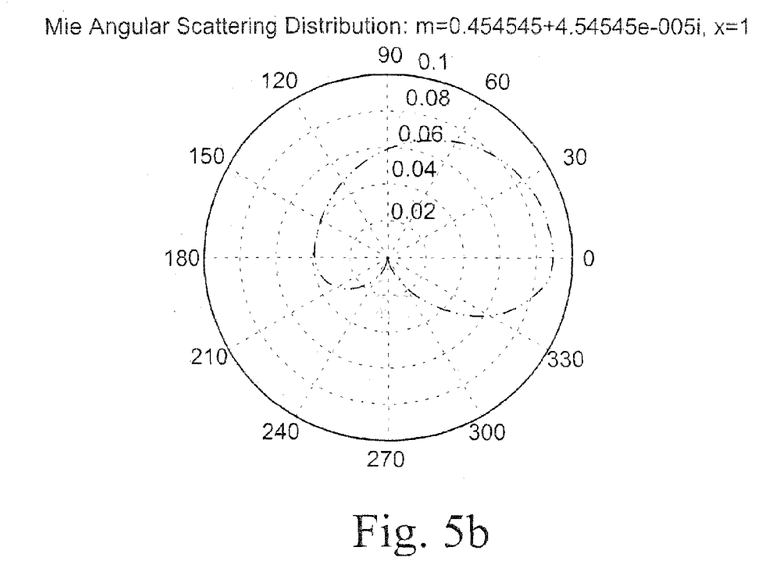
FIG. 5b shows half angular distributions for $\Gamma(\theta)$ at the top half of the graph, and $\Gamma(\phi)$ at the bottom half of the graph, at different scattering angles, in accordance with certain example embodiments.

FIG. 5a is a graph plotting the scattering efficiency of one scatterer in connection with certain example embodiments. The graph is a function of $x=2\pi rm/\lambda$, where the symbols $\pi$, r, and $\lambda$ keep their usual meanings, and where m is the relative refractive index ratio (ns/nm). In the regime of single scatter event, the total scatter function is a summation of all scatters in a given volume. FIG. 5b shows half angular distributions for $\Gamma(\theta)$ at the top half of the graph, and $\Gamma(\phi)$ at the bottom half of the graph, at different scattering angles, in accordance with certain example embodiments. Both functions are substantially symmetrical about the horizontal axis. Thus, it can be seen from FIG. 5b that there are two half curves that are (i) the polar (top half) and (ii) Azimuthal (bottom half) of the scattering distribution function. It will be appreciated that plot (i) could be drawn in its entirety by basically reflecting about the x axis of the curve, and that the same applies to plot (ii). Because each half plot is substantially symmetric about the x axis, a measure of how the whole scattering function works is conveyed.

Figure 6:
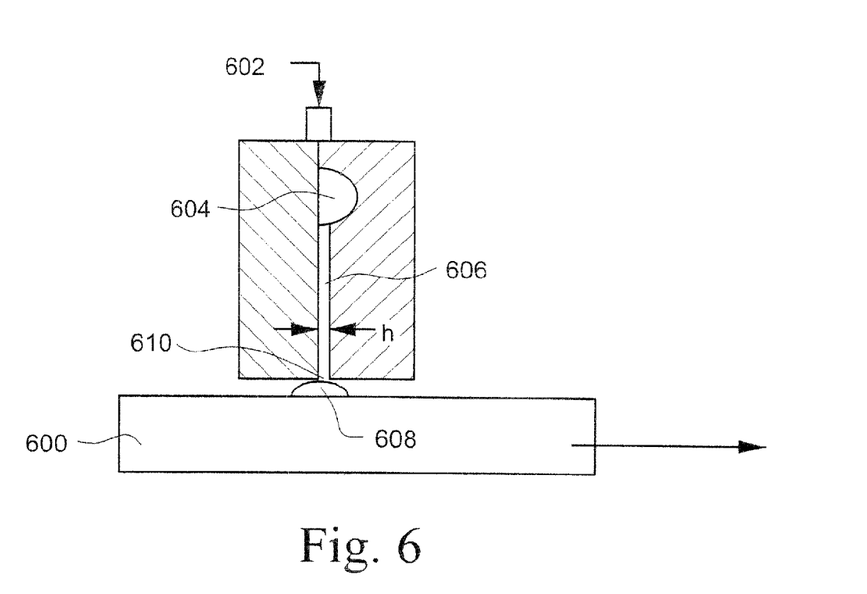
FIG. 6 is a schematic view of a slot meniscus coater, dispensing a matrix with scatterers, in accordance with certain example embodiments.

FIG. 6 is a schematic view of a slot meniscus coater, dispensing a matrix with scatterers, in accordance with certain example embodiments. In the FIG. 6 embodiment, the coater is stationary as the substrate 600 moves relative to it, although this need not always be the case in different example embodiments (e.g., the coater may move while the substrate 600 is stationary). The material to be coated is inserted into the coater at an inlet 602. Excess material is at least temporarily held in a cavity 604, as the remainder proceeds down the slot 606. The width h of the slot 606 is helps in the formation of the meniscus 608 proximate to the slot exit 610.

Of course, it will be appreciated that higher or lower separations may be provided in certain example embodiments. It also will be appreciated that the scatterers need not necessarily be perfectly spherical and other shapes (e.g., eye-shaped spheres, oblong spheres, etc.) may be used (and potentially "mixed and matched") in different example embodiments. Cylinders also may be used and may prove beneficial in some cases, e.g., as a result of their anisotropy.

An optional planarization layer may be over-coated onto the cured matrix and scattering layers. The planarization layer may comprise a zinc-based chelate (e.g., a ZnO-inclusive polymer layer), and may help to anneal out roughness remaining from the scattering layer. This layer can be dispensed by a slot meniscus coater and cured, by heat and/or UV. After curing, the ZnO-inclusive polymer layer also may help act as a seed for the anode disposed thereon. For instance, this planarization layer may serve as a seed for an ITO inclusive film that is deposited by, for example, MSVD or other suitable process. The planarization layer therefore may be compatible with the ITO deposition and processing techniques.

It therefore will be appreciated that a transparent conductive oxide (TCO), such as ITO or the like, may be disposed directly or indirectly on the planarization layer. This TCO may help to ensure that the final OLED stack is function in an electro-optically desirable manner. However, the TCO layer need not necessarily be considered a part of the OCLS in all example embodiments.

One natural modeling approach to aid in understanding light trapping in OLED devices is based on ray tracing techniques. Such techniques also may be used to model many properties of the scattering matrix. Unfortunately, however, ray tracing is somewhat disadvantageous in that it tends to underestimate backscattering. Thus, certain example embodiments advantageously make use of the Mie Scattering Model. The scattering coefficients an, bn, en and dn, and are calculated, and the scattering matrix is computed. The amplitude of the scattered field can then be computed as a function of the incident field:

$$\begin{pmatrix} E_{\|s} \\ E_{\perp s} \end{pmatrix} = \frac{e^{ik(r-z)}}{-ikr} \begin{pmatrix} S_2 & S_3 \\ S_4 & S_1 \end{pmatrix} \begin{pmatrix} E_{\|i} \\ E_{\perp i} \end{pmatrix}$$

The elements of the amplitude scattering matrix in general depend on the scattering angle and the azimuthal angle. Stokes parameters (which generally refer to the set of values that describe the polarization state of electromagnetic radiation) are incorporated into the amplitude scattering matrix, and the procedure as per van de Hulst (e.g., in "Light Scattering by Small Particles," Dover Books on Physics, 1981) may be followed. In order to test the validity of the assumption, the onset of multiple scattering may be computed for simple spherical scatterers, the radiative transfer method described per Chandrasekhar (e.g., in "Radiative Transfer," Dover Books on Physics, 2011) may be followed.

Figure 7:
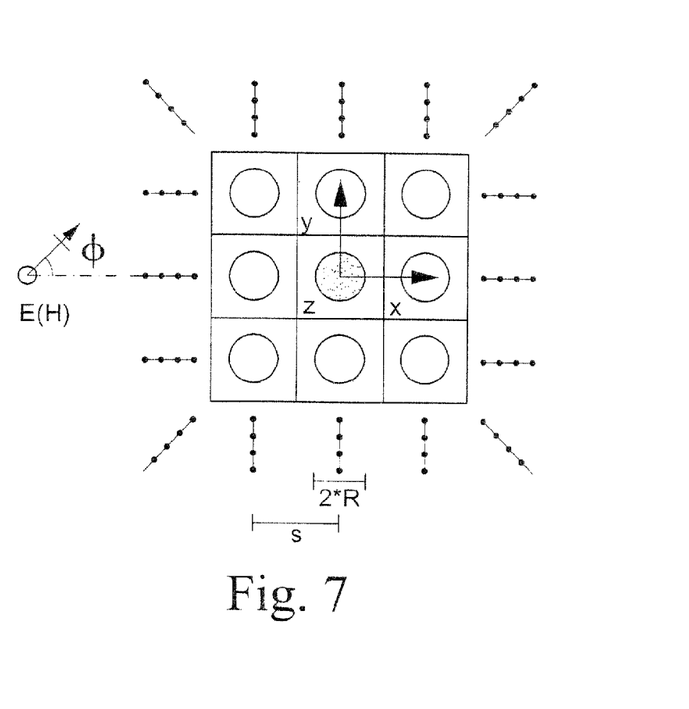
FIG. 7 is a graphical formulation of the light trapping problem to be solved.

FIG. 7 is a graphical formulation of the light trapping problem to be solved. A two-dimensional cross-sectional array of dielectric rods of diameter b=2R in a periodic square lattice, with a period a=S, is shown in the in the FIG. 7 formulation.

Referring once again to FIG. 5a, it can be seen that the first maximum in the scattering efficiency where x is equal to about 4. With an x-value of 4 and for a value of m equal to about 0.45, this corresponds to a value of d of from about 0.8-1.6 microns. Now, using the condition that s is about 3*d, one achieves a number density ranging from 0.5 to 1 particle per cubic micron, depending on the packing density. These parameters also explain why the thickness of the scattering layer to be in the order of at least 10 microns.

Effective medium approximation (EMA) refers to physical models that describe the macroscopic properties of a medium based on the properties and relative fractions of its components. The following equations may help determine the effective medium approximation (EMA) for the matrix in the different modes:

For the transverse magnetic mode where there is no magnetic field in the z direction (TMz mode), with p polarization:

$$\varepsilon_{\mathit{eff}} = \varepsilon_0 + \frac{\pi^2}{3}[f(1-f)(\varepsilon_2 - \varepsilon_1)]^2 \alpha^2 + O(\alpha^4)$$

For the transverse electric mode where there is no magnetic field in the z direction (TEz mode), with s polarization:

$$\varepsilon_{\mathit{eff}} = \frac{1}{a_0} + \frac{\pi^2}{3}\left[f(1-f)\frac{(\varepsilon_2-\varepsilon_1)}{\varepsilon_2 \varepsilon_1}\right]^2 \frac{\varepsilon_0}{a_0^3} \alpha^2 + O(\alpha^4)$$

The symbols (e.g., $\pi$ and $\in_{\mathit{eff}}$) take their usual meanings. In addition, in the above equations:

$a_0 = f/\in_2 - (1-f)/\in_1, \in_0 = \in_2 f - \in_1(1-f)$, and $\alpha = 2R/\lambda_0$.

It is noted that the refractive index n of the OCLS may be equal to about the square root of epsilon. The index may be graded in certain example embodiments, e.g., as a function of the thickness (or z-axis) of the OCLS. The grading may be from nearly n=2 (e.g., if the anode is of or includes ITO) down to about 1.5 towards the glass. It also is noted that it is possible in certain example embodiments to use a metal grid instead of ITO for the anode. For instance, the grid may be coated with a field matrix hole injection layer followed by the EL layer and, in this particular case, the index of the OCLS may be graded from about 1.88 to the value of glass, e.g., as a function of z.

In certain example embodiments, the scatterers may get smaller near the surface, e.g., in terms of the diameters or major distances of the various distributions. For instance, the size may be graded from a 2 micron average diameter or major distance to 0.5 microns and even to a nanometric level at the surface.

Figure 8:
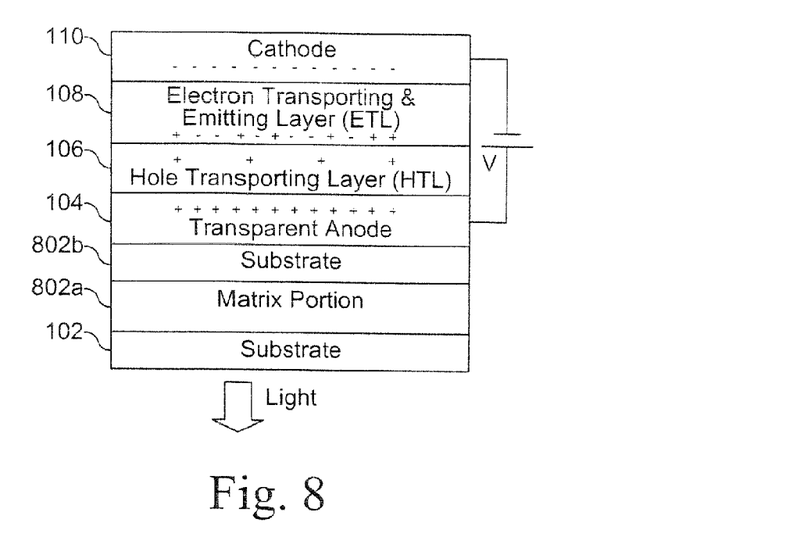
FIG. 8 is a schematic cross-sectional view of an OLED device according to certain example embodiments.
Figure 9:
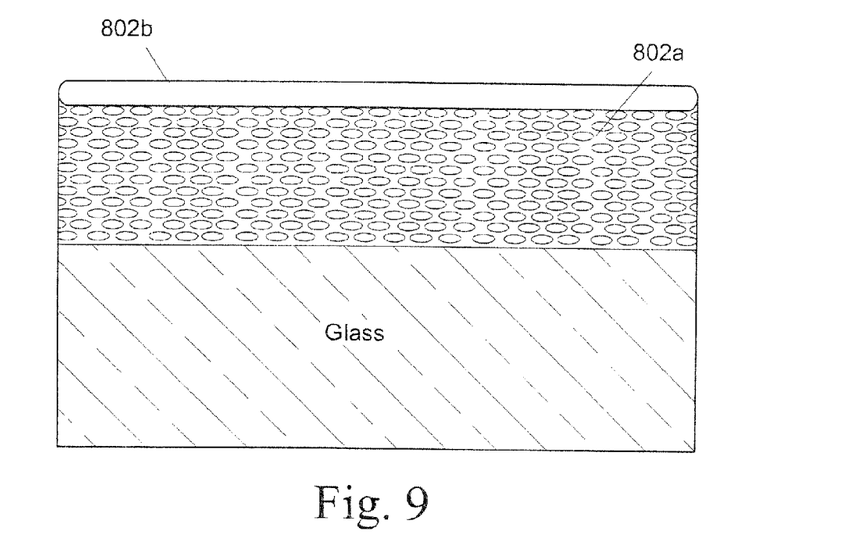
FIG. 9 is an enlarged view of the OCLS system shown in the FIG. 8 example.

FIG. 8 is a schematic cross-sectional view of an OLED device according to certain example embodiments, and FIG. 9 is an enlarged view of the OCLS system shown in FIG. 8. As shown in FIGS. 8-9, the OCLS system comprises the matrix portion 802a and the planarizer portion 802b. The OCLS system is interposed between the substrate 102 and the anode 104 (e.g., of or including ITO). The Mie-like scatterers included in the matrix portion 802a help reduce the total amount of internal reflections, which otherwise would in large part constitute "lost light." Example thicknesses of the various layers and the roughness of the planarizer portion 802b are set forth above. The FIG. 8 cathode 110 may be reflective, e.g., to help reduce TIR. In some cases, reflectance of the cathode 110 is greater than 50%, more preferably greater than 75%, and still more preferably greater than 80%. In some cases, the reflectance may be 85-90%, or even higher.

In certain example embodiments, the scattering layer may alternatively or additionally be placed on surface 1 of the glass. Doing so may in some cases increase the probability of out-coupling, while at the same time helping to attenuate reflection from the OLED. Scratch resistance, environmental stability, and/or other ruggedness aspects of the OCLS system may be enhanced to help it survive this potentially more harsh environment.

Figure 10:
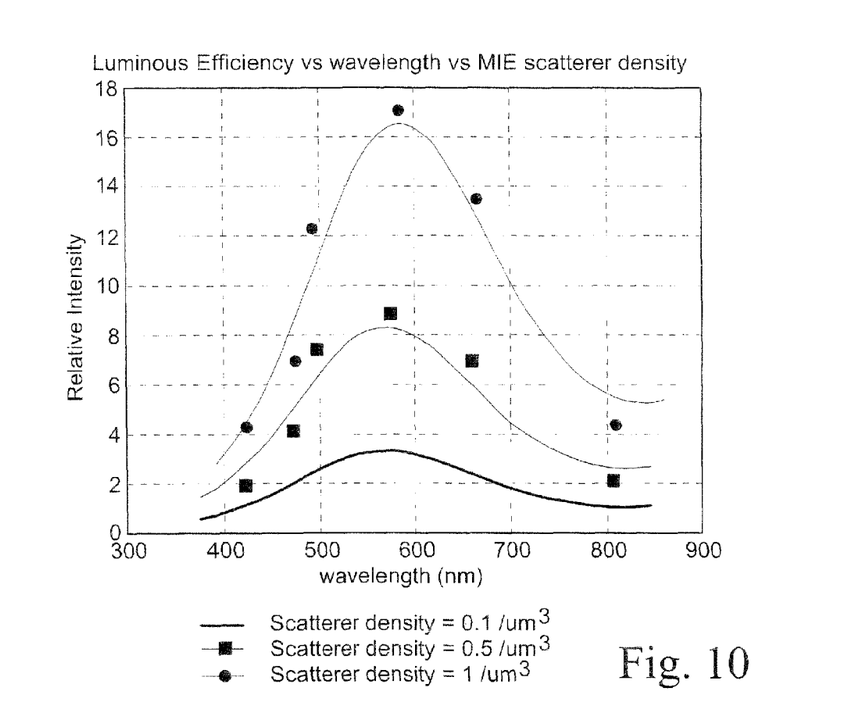
FIG. 10 is a graph showing theoretical luminous efficiencies, integrated over a half sphere, as a function of wavelength for different scatterer densities.

FIG. 10 is a graph showing theoretical luminous efficiencies, integrated over a half sphere, as a function of wavelength for different scatterer densities. As can be seen from the FIG. 10 graph, higher scattering densities translate into higher theoretical luminous intensities at all wavelengths.

Figure 11:
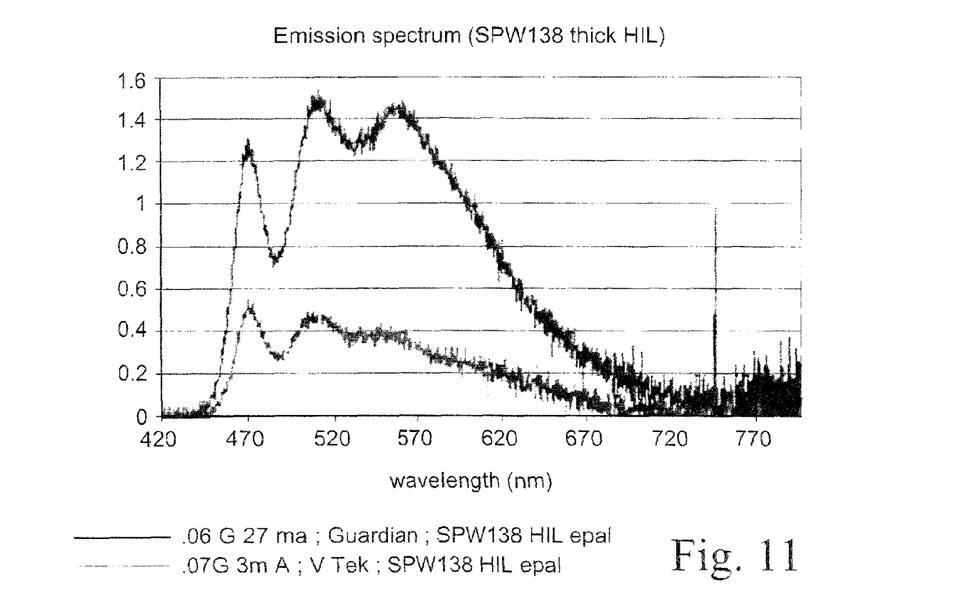
FIG. 11 is a graph plotting the actual emission spectrum from two example PLED devices.

The FIG. 11 graph generally confirms the more theoretical FIG. 10 graph. That is, FIG. 11 is a graph plotting the actual emission spectrum from two example PLED devices. The lower line in FIG. 11 represents a PLED device that lacks an OCLS system, whereas the upper line corresponds to a PLED device having an OCLS system with a 35 micron thick scatterer layer that has been planarized. In the latter example, the anode included a layer comprising ITO supported by a seed layer comprising zinc oxide, and the layer comprising ITO was ion beam etched, e.g., so as to improve its smoothness. The scatterers used were optically soft silicate spheres in a Ti based chelate.

As will be appreciated from the above, in certain example scenarios, the index matching out-coupling efficiency (>1) is boosted by a Mie-like scattering efficiency greater than one. The matrix containing the scatterers is itself a high index inorganic chelate. The scatterers are prepared, e.g., so that they comprise one or more materials. For instance, scatterers may have a concentric composition that increases scattering in some cases. The relative refractive index m, size r, and concentration of the scatterers ($1/s^3$) are chosen so that they help improve total integrated light out-coupled from the devices.

In certain example embodiments, the OCLS system may have one or more of the following and/or other advantageous characteristics:
  Ability to induce forward scattering;
  Ability to redirect light waveguide modes;
  Ability to promote Mie-like scattering, thereby reducing (and sometimes even eliminating) spectral dispersion;
  Hygroscopic scatterer material, with possible getters;
  Non-clumping and non-absorbing scatterer and matrix;
  Planarizer index-matched to underlying layers (e.g., ITO AND light emitting organic layer compositions); and/or
  Compatibility with vacuum deposition and heat treatments (including those typically used, e.g., in ITO deposition).

Certain example embodiments may be used in connection with soda lime silicate glass, and/or so-called low-iron glass. For instance, the substrate 102 in FIG. 8, for example, may be a low-iron glass substrate, Low-iron glass is described in, for example, U.S. Pat. Nos. 7,893,350; 7,700,870; 7,557,053; 6,299,703; and 5,030,594, and U.S. Publication Nos. 2006/0169316; 2006/0249199; 2007/0215205; 2009/0223252; 2010/0122728; 2010/0255980; and 2011/0275506, The entire contents of each of these documents is hereby incorporated herein by reference.

Although certain example embodiments have been described in connection with OLEDs and/or PLEDs, it will be appreciated that the techniques described herein may be used in connection with other types of light emitting diodes (LEDs) including, for example, inorganic light emitting diodes, and/or other lighting systems, etc.

In certain example embodiments, a method of making an electronic device is provided. An optical out-coupling layer stack (OCLS) is disposed, directly or indirectly, on a substrate. A layer comprising a transparent conductive coating (TCC) is disposed, directly or indirectly, on the OCLS. One or more light emitting layers is/are disposed, directly or indirectly, on the layer comprising the TCC. A layer comprising conductive material is disposed, directly or indirectly, on the one or more light emitting layers. The OCLS comprises an isotropic layer matrix including an organo-metallic chelate hybrid material and a matrix core including dispersed scatterers. The OCLS has an index of refraction of at least about 1.8. The dispersed scatterers have a Mie-like scattering efficiency of greater than 1, leading to an index matching out-coupling efficiency for the OCLS of greater than 1.

In addition to the features of the previous paragraph, in certain example embodiments, the matrix may include a polymeric monomer to which oxo-clusters are added.

In addition to the features of the previous paragraph, in certain example embodiments, the oxo-clusters may include Ti, Hf, and/or Zr oxo-clusters.

In addition to the features of either of the two previous paragraphs, in certain example embodiments, polymerization of the monomer may be performed in the presence of 10-30% by weight of $Zr_4O_2(OMc)_{12}$.

In addition to the features of any of the four previous paragraphs, in certain example embodiments, the matrix may at least initially have an organic surface including $Ti_{16}O_{16}(OEt)_{32}$ that is modified and/or is modifiable by via alcoholysis.

In addition to the features of the previous paragraph, in certain example embodiments, the alcoholysis may create new functional clusters including $Ti_{16}O_{16}(OEt)_{32-x}(OR)_x$.

In addition to the features of the previous paragraph, in certain example embodiments, R may be a methacrylate or styrene, and x may be the number of modified alkoxys, x preferably being between 4 and 16, inclusive.

In addition to the features of any of the seven previous paragraphs, in certain example embodiments, the scatterers may be generally spherical and/or generally cylindrical.

In addition to the features of any of the eight previous paragraphs, in certain example embodiments, a filling density of the scatterers may be in a range of values such that the scatterers are mono-dispersed with an inter-particle distance d of about 3 diameters or major distances.

In addition to the features of the previous paragraph, in certain example embodiments, each scatterer may be located in the far field of its nearest neighbor and there may be no systematic phase relationship, except for coherent exact forward scattering.

In addition to the features of either of the two previous paragraphs, in certain example embodiments, the refractive index for the OCLS may be 1.8-1.9, and the absorption coefficient for the OCLS may be at or near 0.

In addition to the features of any of the 11 previous paragraphs, in certain example embodiments, the electronic device may be an organic light emitting diode (OLED) inclusive device, wherein the one or more light emitting layers may comprise first and second organic layers, and wherein the layer comprising conductive material may be reflective.

In addition to the features of any of the 12 previous paragraphs, in certain example embodiments, a planarization layer may be disposed between the matrix and the layer comprising the TCC.

In addition to the features of the previous paragraph, in certain example embodiments, the RMS roughness of the planarization layer may be less than 1.0 nm.

In addition to the features of the previous paragraph, in certain example embodiments, the planarization layer may comprise a zinc-based chelate.

In certain example embodiments, a method of making an organic light emitting diode (OLED) inclusive device is provided. A layer comprising a transparent conductive coating (TCC) is disposed, directly or indirectly, on a glass substrate. First and second organic layers are disposed, directly or indirectly, on the layer comprising the TCC. A layer comprising a conductive material is disposed, directly or indirectly, on the one or more light emitting layers, the layer comprising conductive material being reflective. An optical out-coupling layer stack (OCLS) is disposed, directly or indirectly, on the substrate, the OCLS including an isotropic layer matrix including an organo-metallic chelate hybrid matrix with scatterers dispersed therein. A relative refractive index m of the OCLS, a size r of the scatterers, and a concentration of the scatterers ($1/s^3$) are selected so as to increase the total integrated light out-coupled from the device to a level where total out-coupling efficiency for the device is greater than it would, if no OCLS were provided.

In addition to the features of the previous paragraph, in certain example embodiments, the matrix may include a polymeric monomer to which oxo-clusters are added.

In addition to the features of the previous paragraph, in certain example embodiments, the scatterers may be generally spherical and have a Zeta potential greater than 70 mV.

In addition to the features of any of the three previous paragraphs, in certain example embodiments, a filling density of the scatterers may be in a range of values such that the scatterers are mono-dispersed with an inter-particle distance d of about 3 diameters or major distances.

In addition to the features of any of the four previous paragraphs, in certain example embodiments, the OCLS may be located on a surface of the substrate opposite the first and second organic layers.

In certain example embodiments, an organic light emitting diode (OLED) inclusive device is provided. A glass substrate is provided. A layer comprising a transparent conductive coating (TCC) is supported by the substrate. First and second organic layers are supported by the layer comprising the TCC. A reflective conductive layer is supported by the first and second organic layers. An out-coupling layer stack (OCLS) is interposed between the organic layers and a viewer of the device. The OCLS includes a hybrid organic-inorganic polymer matrix having scatterers dispersed throughout in a manner such that each scatterer is located in the far field of its nearest neighbor, the scatterers being sized, shaped, and positioned relative to one another so as to (a) have a high Zeta potential, and (b) promote Mie-like scattering of light passing through the OCLS.

In addition to the features of the previous paragraph, in certain example embodiments, there may be no or substantially no systematic phase relationship in connection with the dispersed scatterers, except for coherent exact forward scattering.

In addition to the features of either of the two previous paragraphs, in certain example embodiments, the matrix may include a polymeric monomer to which Ti, Hf, and/or Zr oxo-clusters are added.

In addition to the features of the previous paragraph, in certain example embodiments, the refractive index for the OCLS may be 1.8-1.9, and the absorption coefficient for the OCLS may be at or near 0.

In addition to the features of any of the four previous paragraphs, in certain example embodiments, the layer comprising the TCC may comprise indium tin oxide and may be set up as an anode, and wherein the reflective conductive layer may be set up as a cathode.

As used herein, the terms "on," "supported by," and the like should not be interpreted to mean that two elements are directly adjacent to one another unless explicitly stated. In other words, a first layer may be said to be "on" or "supported by" a second layer, even if there are one or more layers there between.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. An organic light emitting diode (OLED) inclusive device, comprising:
    a glass substrate;
    a layer comprising a transparent conductive coating (TCC), supported by the substrate;
    first and second organic layers supported by the layer comprising the TCC;
    a reflective conductive layer supported by the first and second organic layers; and
    an out-coupling layer stack (OCLS), interposed between the organic layers and a viewer of the device,
    wherein the OCLS includes a hybrid organic-inorganic polymer matrix having scatterers dispersed throughout in a manner such that each scatterer is located in the far field of its nearest neighbor, the scatterers being sized, shaped, and positioned relative to one another so as to (a) have a high Zeta potential, and (b) promote Mie-like scattering of light passing through the OCLS.

2. The device of claim 1, wherein there is no or substantially no systematic phase relationship in connection with the dispersed scatterers, except for coherent exact forward scattering.

3. The device of claim 1, wherein the matrix includes a polymeric monomer to which Ti, Hf, and/or Zr oxo-clusters are added.

4. The device of claim 3, wherein the refractive index for the OCLS is 1.8-1.9, and the absorption coefficient for the OCLS is at or near 0.

5. The device of claim 1, wherein the layer comprising the TCC comprises indium tin oxide and is set up as an anode, and wherein the reflective conductive layer is set up as a cathode.

* * * * *